US011997841B2

(12) United States Patent
Lou et al.

(10) Patent No.: US 11,997,841 B2
(45) Date of Patent: May 28, 2024

(54) AIR VENT WITH OPENINGS OF NON-UNIFORM SIZE AND LOCATION FOR IMPROVED EMI SHIELDING

(71) Applicant: Cisco Technology, Inc., San Jose, CA (US)

(72) Inventors: Jianquan Lou, Shanghai (CN); Alpesh Umakant Bhobe, Sunnyvale, CA (US); Jerrold Mark Pianin, Peoria, AZ (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/512,019

(22) Filed: Oct. 27, 2021

(65) Prior Publication Data

US 2023/0008116 A1 Jan. 12, 2023

Related U.S. Application Data

(60) Provisional application No. 63/220,141, filed on Jul. 9, 2021.

(51) Int. Cl.
*H05K 9/00* (2006.01)
(52) U.S. Cl.
CPC ......... *H05K 9/0041* (2013.01); *H05K 9/0062* (2013.01)

(58) Field of Classification Search
CPC .................... H05K 9/0041; H05K 9/0062
USPC .................................. 361/679.46
See application file for complete search history.

(56) References Cited

U.S. PATENT DOCUMENTS

| 2003/0030992 | A1* | 2/2003 | Kim ................ G06F 1/184 |
| 2004/0118581 | A1* | 6/2004 | Kopf ................ H05K 9/0062 |
| 2004/0233654 | A1* | 11/2004 | Lin ................ H05K 9/0041 |
| | | | 361/818 |
| 2007/0289776 | A1 | 12/2007 | Liang et al. |
| 2007/0297160 | A1* | 12/2007 | Cochrane ........... H05K 9/0015 |
| | | | 361/818 |
| 2014/0140001 | A1* | 5/2014 | Gerken ............... H05K 9/00 |
| | | | 361/690 |
| 2020/0236825 | A1 | 7/2020 | Chia et al. |
| 2021/0022275 | A1* | 1/2021 | Embleton ......... H05K 7/20727 |

* cited by examiner

*Primary Examiner* — Zhengfu J Feng
(74) *Attorney, Agent, or Firm* — Edell, Shapiro & Finnan, LLC

(57) ABSTRACT

Presented herein is an air vent including a plate, and a non-uniform array of openings extending through a thickness of the plate. The non-uniform array of openings arranged to admit a flow of cooling air through the plate. The plate and the non-uniform array of openings are arranged to attenuate electromagnetic interference (EMI) emitted through the plate.

20 Claims, 12 Drawing Sheets

Database 1: Air Vent Model Database

| Pattern ID | % Opening ($\Omega$) | Minimum Webbing (W) | Number of Openings (N) | Plate Thickness (T) | Radius (min) | Radius (max) | $O_{A1}$ Center | $R_{A1}$ (Radius of $O_{A1}$) | $O_{A2}$ Center | $R_{A2}$ (Radius of $O_{A2}$) | ... | $O_{ij}$ Center | $R_{ij}$ (Radius of $O_{ij}$) |
|---|---|---|---|---|---|---|---|---|---|---|---|---|---|
| 1 | $\Omega_1$ | $W_1$ | $N_1$ | $T_1$ | $R_{1u}$ | $R_{1u}$ | $X_{A1}, Y_{A1}$ | $R_{1u}$ | $X_{A2}, Y_{A2}$ | $R_{1u}$ | | $X_{ij}, Y_{ij}$ | $R_{ij}$ |
| 2 | $\Omega_2$ | $W_2$ | $N_2$ | $T_2$ | $R_{2min}$ | $R_{2max}$ | $X_{A1}, Y_{A1}$ | $R_{A1}$ | $X_{A2}, Y_{A2}$ | $R_{A2}$ | | $X_{ij}, Y_{ij}$ | $R_{ij}$ |
| 3 | $\Omega_3$ | $W_3$ | $N_3$ | $T_3$ | $R_{3min}$ | $R_{3max}$ | $X_{A1}, Y_{A1}$ | $R_{A1}$ | $X_{A2}, Y_{A2}$ | $R_{A2}$ | | $X_{ij}, Y_{ij}$ | $R_{ij}$ |
| . | . | . | . | . | . | . | . | . | . | . | | . | . |
| . | . | . | . | . | . | . | . | . | . | . | | . | . |
| . | . | . | . | . | . | . | . | . | . | . | | . | . |
| $P_m$ | $\Omega_m$ | $W_m$ | $N_m$ | $T_m$ | $R_{mmin}$ | $R_{mmax}$ | $X_{A1}, Y_{A1}$ | $R_{A1}$ | $X_{A2}, Y_{A2}$ | $R_{A2}$ | | $X_{ij}, Y_{ij}$ | $R_{ij}$ |

FIG.4A

Database 2: Signal Emanation Database

| Pattern ID | % Opening ($\Omega$) | Minimum Webbing (W) | Number of Openings (N) | Plate Thickness (T) | Radius (min) | Radius (max) | SE(f1) | SE(f2) | ... | SE(fn) |
|---|---|---|---|---|---|---|---|---|---|---|
| 1 | $\Omega_1$ | $W_1$ | $N_1$ | $T_1$ | $R_{1\text{min}}$ | $R_{1\text{max}}$ | $SE_{1f1}$ | $SE_{1f2}$ | | $SE_{1fn}$ |
| 2 | $\Omega_2$ | $W_2$ | $N_2$ | $T_2$ | $R_{2\text{min}}$ | $R_{2\text{max}}$ | $SE_{2f1}$ | $SE_{2f2}$ | | $SE_{2fn}$ |
| 3 | $\Omega_3$ | $W_3$ | $N_3$ | $T_3$ | $R_{3\text{min}}$ | $R_{3\text{max}}$ | . | . | | . |
| . | . | . | . | . | | | . | . | | . |
| . | . | . | . | . | | | . | . | | . |
| . | . | . | . | . | | | . | . | | . |
| $P_m$ | $\Omega_m$ | $W_m$ | $N_m$ | $T_m$ | $R_{m\text{min}}$ | $R_{m\text{max}}$ | $SE_{mf1}$ | $SE_{mf2}$ | | $SE_{mfn}$ |

FIG.4B

AIR VENT WITH OPENINGS OF NON-UNIFORM SIZE AND LOCATION FOR IMPROVED EMI SHIELDING

CROSS-REFERENCE TO RELATED APPLICATION

This application claims priority to U.S. Provisional Application No. 63/220,141, filed Jul. 9, 2021. The entirety of this application is incorporated herein by reference.

TECHNICAL FIELD

The present disclosure relates to an air vent for a computer chassis or other electrical or electronic apparatus.

BACKGROUND

Generally, air vents on a system chassis are designed to shield unwanted electromagnetic energy, while at the same time allow efficient airflow to cool the system. Vent hole perforation patterns of uniform size and shape are typically used to balance electromagnetic interference (EMI) and thermal requirements. There is a tension between thermal design (calling for larger, less restrictive openings) and electromagnetic shielding (which benefits from smaller openings). With the speed and power consumption of computing systems increasing with new product generation, striking a balance between reducing EMI and meeting thermal requirements has become more challenging.

BRIEF DESCRIPTION OF THE DRAWINGS

FIG. 4A is a data table indicative of air vent opening patterns with corresponding parameters, according to an example embodiment.

FIG. 4B is a data table indicative of air vent opening pattern parameters and corresponding simulated signal emission frequencies, according to an embodiment.

DESCRIPTION OF EXAMPLE EMBODIMENTS

Overview

In one form, presented herein is an air vent including a plate, and a non-uniform array of openings extending through a thickness of the plate. The non-uniform array of openings is arranged to admit a flow of cooling air through the plate. The plate and the non-uniform array of openings are arranged to attenuate electromagnetic interference (EMI) emitted through the plate.

Example Embodiments

Figure 1A:
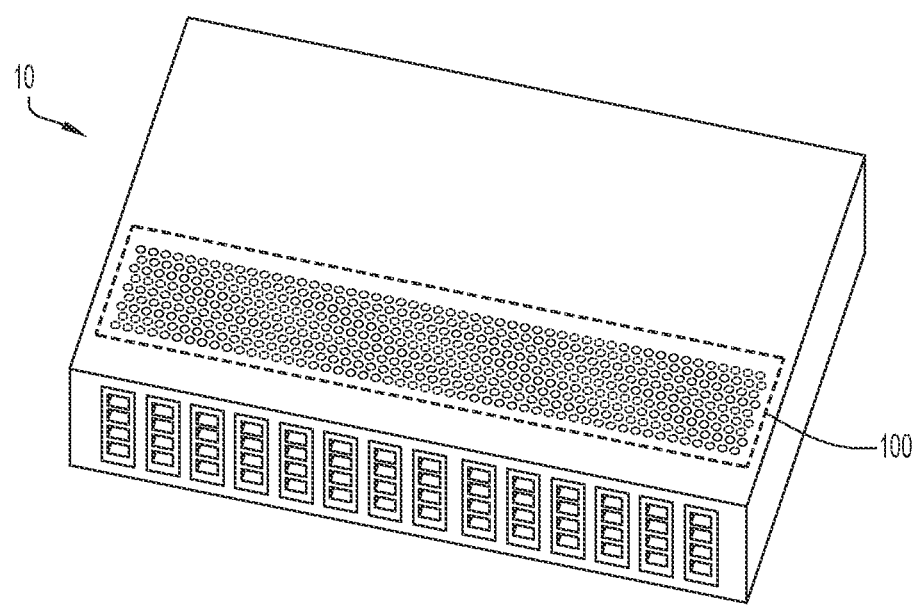
FIGS. 1A and 1B depict examples of conventional chassis with air vents.
Figure 1B:
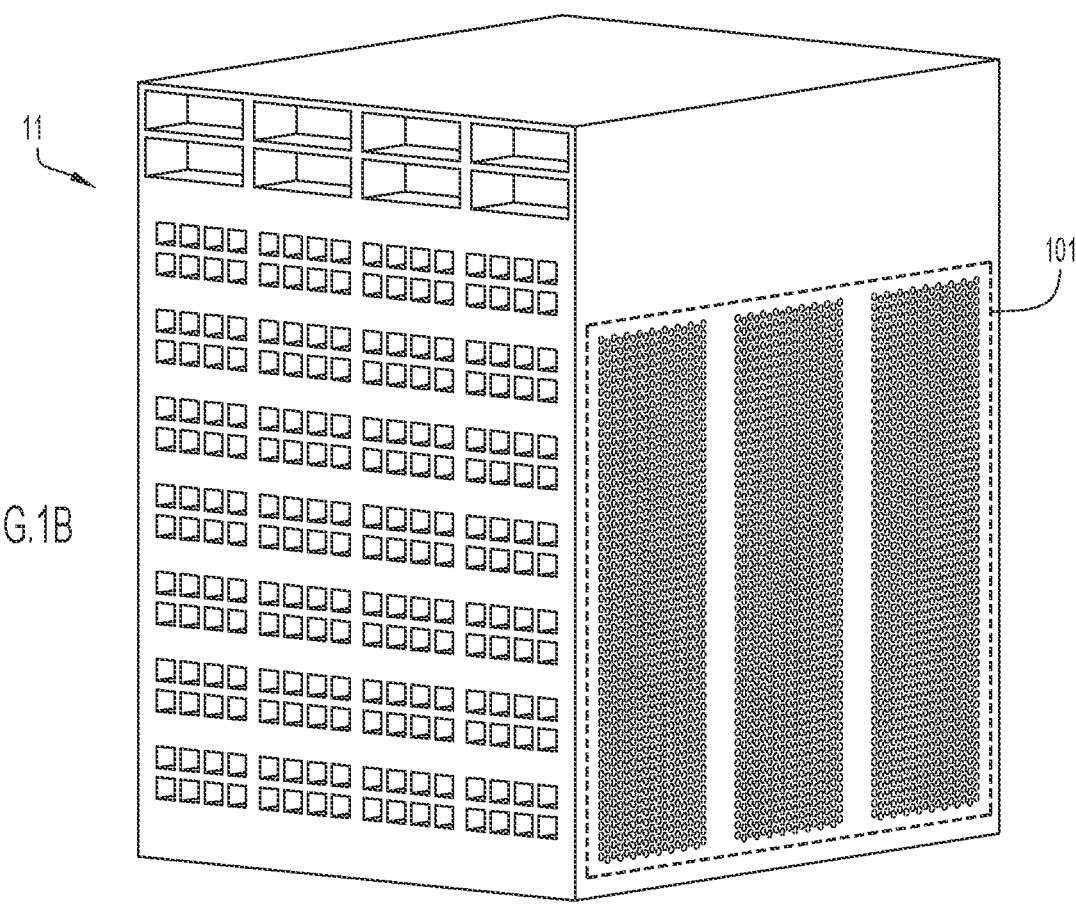
Figure 1C:
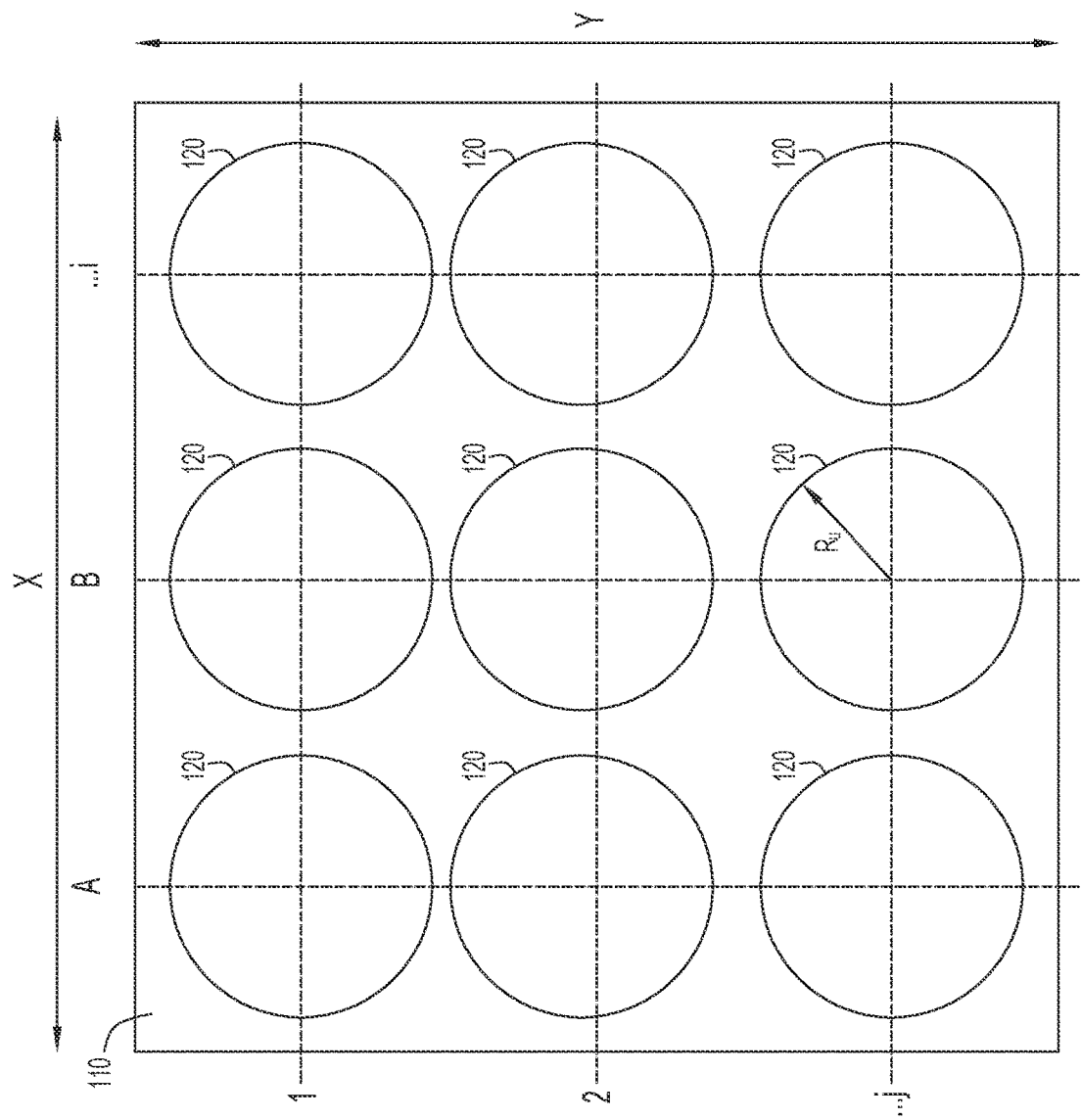
FIG. 1C depicts a conventional air vent with uniform openings.

Reference is first made to FIGS. 1A-1C. FIGS. 1A and 1B depict conventional chassis 10, 11 covered by air vents 100, 101 that admit or allow air to flow through electrical components disposed in the chassis 10, 11. Referring to FIG. 1C, the air vent 100, 101 generally comprises a panel or a plate 110 having an array of uniform openings 120. The openings 120 may be perforations in the plate 110. The plate 110 may comprise sheet metal. The plate 110 is shown with uniform opening shape (e.g., circle) and uniform lattice (same webbing, radius/diameter of opening, etc.). That is, the uniform openings 120 have a uniform shape, uniform radii $R_u$, and uniform spacing along the plate 110. Said yet another way, the centers of each opening 120 are aligned along a respective evenly spaced vertical axes (A, B, ..., i) and a respective evenly spaced horizontal axes (1, 2, ... j). Thus, the openings are arranged along rows aligned with the horizontal axes and columns that are aligned with the vertical axes (A, B, ..., i).

Electromagnetic interference (EMI) requirements dictate smaller air vent openings, or holes, 120 that are configured to move the EMI cutoff frequency much higher than the operating frequency of the device that is being shielded—while thermal design requirements prefer larger air vent openings 120 for more airflow for efficient cooling. EMI requirements and thermal design concerns compete with each other. That is, air vents with a large percentage of openings have less EMI shielding than air vents with a smaller percentage of openings. Currently, more vent opening shapes are studied and adopted to balance EMI with desired thermal properties. For example, a circle, square, hexagon and even some complex opening shapes have been considered. However, the improvement from opening shape alone is limited. Additionally, the thickness of the vent plate can also improve EMI shielding with little to no impact on thermal performance. For example, the thicker the vent plate defining the openings, the greater the EMI shielding. However, a thicker plate may result in a heavier chassis and additional manufacturing cost.

At high frequencies (10 GHz or higher), EMI radiation leaks through air vents in a system chassis. Typically, these air vents are designed with a minimum percentage opening Ω (e.g., a percentage of the vent plate area defining the openings) to meet the thermal properties of the chassis. For current as well as future high speed networking products and other computing, storage or electronic products, 1 dB of additional shielding by air vents could be the crucial dB of shielding that could result in the product meeting regulatory EMI requirements. An air vent having openings of different (non-uniform) sizes and locations achieves better EMI shielding in a certain frequency range, while keeping the same air ventilation rate as with uniform opening and center location.

Figure 2A:
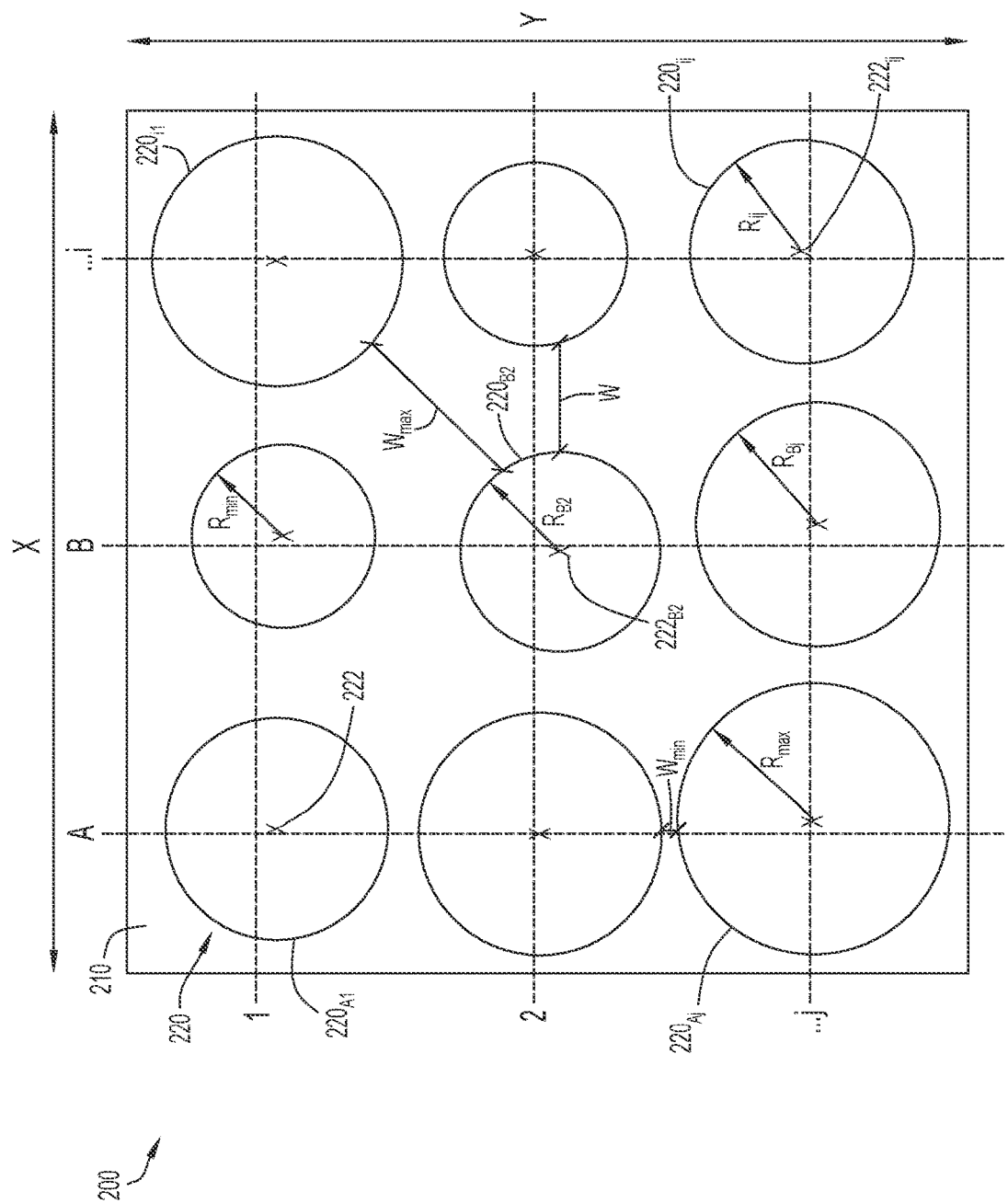
FIG. 2A depicts a non-uniform air vent, according to an example embodiment.

Now referring to FIG. 2A, a portion of an air vent 200 comprising a plate 210 with a non-regular or non-uniform pattern or array of openings 220, according to an example embodiment, is illustrated. For clarity, a plurality of vertical axes A, B, ... i, a plurality of horizontal axes 1, 2, ... j, an x-axis and a y-axis are aligned with the plate 210 at regular intervals, as depicted in FIG. 2A. Each vertical axis of the plurality of vertical axes (A, B, . . . i) is aligned with a corresponding non-uniform column of openings 220 with the index i. Similarly, each horizontal axis of the plurality of horizontal axes (1, 2, . . . j) is aligned with a corresponding non-uniform row of openings 220 with the index j. Each opening $220_{ij}$ of the array of openings 220 corresponds to an intersection of a vertical axis i and horizontal axis j. While three vertical and horizontal axes are shown, the plate 210 may have any number i of vertical axes, any number j of horizontal axes, and any number of openings $220_{ij}$. Further, the plate 210 may extend for any desired length along the x-axis and width along the y-axis. Additionally, an adjacent opening is considered an opening that is offset by one column and/or one row. For example, in the depicted embodiment (where i=C and j=3), opening $220_{A2}$ is at least adjacent to openings $220_{A1}$, $220_{A3}$, $220_{B1}$, $220_{B2}$, and $220_{B3}$.

Each opening $220_{ij}$ of the non-uniform array of openings 220 includes a center 222 and a radius R. The non-uniform array of openings 220 are arranged along the horizontal and vertical axes i, j in a non-uniform, grid-like pattern, such that a center $222_{ij}$ of an opening $220_{ij}$ is not vertically or horizontally aligned with an adjacent opening $220_{i+1,j}$, $220_{i,j+1}$, $220_{i-1,j}$, $220_{i,j-1}$, $220_{i+1,j+1}$, $220_{i-1,j-1}$, $220_{i+1,j-1}$, and $220_{i-1,j+1}$. Said another way, each center $222_{ij}$ deviates from its respective horizontal axis (1, 2, . . . j) and vertical axis (A, B, . . . i) by a different amount than deviations of centers $222_{ij}$ of adjacent openings $220_{i+1,j}$, $220_{i,j+1}$, $220_{i-1,j}$, $220_{i,j-1}$, $220_{i+1,j+1}$, $220_{i-1,j-1}$, $220_{i+1,j-1}$, and $220_{i-1,j+1}$ to their respective horizontal axis (1, 2, . . . j) and vertical axis (A, B, . . . i).

For example, the air vent 200 is depicted in FIG. 2A with three vertical axes (e.g., i=C) and three horizontal axes (e.g., j=3), and opening $220_{B2}$ has a center $222_{B2}$ that is not vertically aligned with center $222_{B1}$ of opening $220_{B1}$ or center $222_{B3}$ of opening $220_{B3}$. Further, center $222_{B2}$ is not horizontally aligned with center $222_{A2}$ of opening $220_{A2}$ or center $222_{C2}$ of opening $220_{C2}$. In some implementations, the center $222_{ij}$ of each opening $220_{ij}$ may be horizontally offset from at least one opening within the same column and vertically offset from at least one opening within the same row. In some implementations, the center $222_{ij}$ of each opening $220_{ij}$ may be horizontally offset from at least two openings within the same column and vertically offset from at least two openings within the same row. In some implementations, the center $222_{ij}$ of each opening $220_{ij}$ may be horizontally offset from at least three openings within the same column and vertically offset from at least three openings within the same row. In yet another implementation, the center $222_{ij}$ of each opening $220_{ij}$ may be horizontally offset from centers all of the other openings within the same column and vertically offset from centers of all other openings within the same row. In some implementations, the centers $222_{ij}$ of each opening $220_{ij}$ may be determined or set using Cartesian coordinates based on the x-axis and the y-axis.

Additionally, or alternatively, a length of the radius R of each opening $220_{ij}$ is different from a length of a radius R of an adjacent opening $220_{i+1,j}$, $220_{i,j+1}$, $220_{i-1,j}$, $220_{i,j-1}$, $220_{i+1,j+1}$, $220_{i-1,j-1}$, $220_{i+1,j-1}$, and $220_{i-1,j+1}$. Said another way, a length of the radius $R_{ij}$ of a first opening $220_{ij}$ is not the same as a length of any Radius R of an adjacent opening $220_{i+1,j}$, $220_{i,j+1}$, $220_{i,j-1}$, $220_{i+1,j+1}$, $220_{i-1,j-1}$, $220_{i+1,j-1}$, and $220_{i-1,j+1}$. For example, the depicted air vent 200 has three vertical axes (e.g., i=C) and three horizontal axes (e.g., j=3), and a first opening $220_{B2}$ has a radius $R_{B2}$ that has a different length than a length of radius $R_{B1}$ of adjacent opening $220_{B1}$, radius $R_{B3}$ of adjacent opening $220_{B3}$, radius $R_{A2}$ of adjacent opening $220_{A2}$, radius $R_{C2}$ of adjacent opening $220_{C2}$, radius $R_{A1}$ of adjacent opening $220_{A1}$, radius $R_{C1}$ of adjacent opening $220_{C1}$, radius $R_{A3}$ of adjacent opening $220_{A3}$. In some implementations, the length of the radius $R_{ij}$ of the each opening $220_{i,j}$ is different from at least two (2) adjacent openings $220_{i+1,j}$, $220_{i,j+1}$, $220_{i-1,j}$, $220_{i,j-1}$, $220_{i+1,j+1}$, $220_{i-1,j-1}$, $220_{i+1,j-1}$, and $220_{i-1,j+1}$. In some implementations, each opening $220_{ij}$ has a radius $R_{ij}$ with a different length than radii of openings that are within two or more columns and/or two or more rows. For example, in the depicted embodiment (where i=C and j=3), a first opening $220_{A1}$ has radius $R_{A1}$ having a different length than the radii R of openings $220_{A2}$, $220_{A3}$, $220_{B1}$, $220_{B2}$, $220_{B3}$, $220_{C1}$, $220_{C2}$, and/or $220_{C3}$. In some implementations, for each opening $220_{ij}$, the length of the radius $R_{ij}$ may be different from radii R of at least two openings within the same column (A, B, . . . i) and/or the same row (1, 2, . . . j). In yet another implementation, for each opening $220_{ij}$ the length of the radius $R_{ij}$ may be different from all lengths of all radii R of all other openings within the same column (A, B, . . . i) and/or the same row (1, 2, . . . j).

By adjusting each radius R and each location of each center 222 of the non-uniform array of openings 220, the distances or webbing W between adjacent openings $220_{i+1,j}$, $220_{i,j+1}$, $220_{i-1,j}$, $220_{i,j-1}$, $220_{i+1,j+1}$, $220_{i-1,j-1}$, $220_{i+1,j-1}$, and $220_{i-1,j+1}$ also is adjusted. That is, the distance between edges of two adjacent openings $220_{ij}$, $220_{i+1,j}$, $220_{i,j+1}$, $220_{i-1,j}$, $220_{i,j-1}$, $220_{i+1,j+1}$, $220_{i-1,j-1}$, $220_{i+1,j-1}$, and $220_{i-1,j+1}$ is dependent upon the location of the centers 222 and the lengths of the radii R of the two adjacent openings $220_{ij}$, $220_{i+1,j}$, $220_{i,j+1}$, $220_{i-1,j}$, $220_{i,j-1}$, $220_{i+1,j+1}$, $220_{i-1,j-1}$, $220_{i+1,j-1}$, and $220_{i-1,j+1}$. Accordingly, configuring the non-uniform array of openings 220 to have non-uniform radii R and non-uniform centers 222 also configures the webbing W to be non-uniform.

While each opening $220_{ij}$ of the non-uniform array of openings 220 are circularly shaped, embodiments are not limited thereto. Each opening $220_{ij}$ may have any desired shape. For example, each opening $220_{ij}$ may have a rectangular, square, triangular, oval, trapezoidal, or other complex shape. In some implementation, each opening $220_{ij}$ may have a different shape than: 1) adjacent openings $220_{i+1,j}$, $220_{i,j+1}$, $220_{i-1,j}$, $220_{i,j-1}$, $220_{i+1,j+1}$, $220_{i-1,j-1}$, $220_{i+1,j-1}$, and $220_{i-1,j+1}$, 2) openings within the same row, and/or 3) openings with the same column. In some implementations, each opening $220_{ij}$ may have a different shape, alignment, and/or orientation than the shapes, alignments and/or orientations of all other openings of the non-uniform array of openings 220.

Figure 2B:
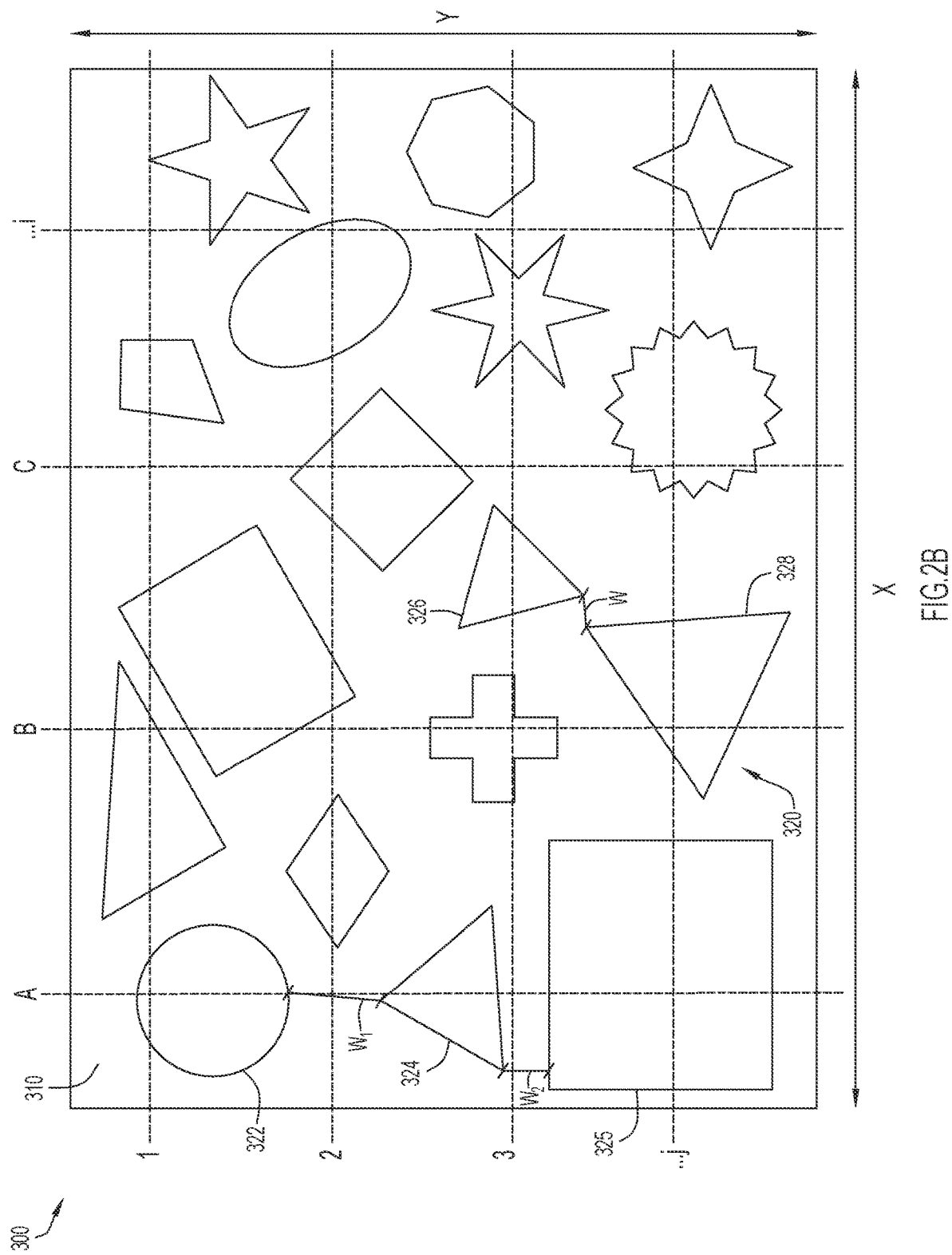
FIG. 2B depicts a non-uniform air vent, according to another example embodiment.

Now referring to FIG. 2B, an air vent 300 having a plate 310 according to another example embodiment is illustrated. For clarity, a plurality of vertical axes A, B, C, . . . i; a plurality of horizontal axes 1, 2, 3, . . . j; an x-axis and a y-axis are aligned with the plate 310, as shown in FIG. 2B. In the depicted embodiment, the plate 310 has four (4) columns (e.g., i=D) and four (4) rows (e.g., j=4) disposed at regular intervals. The plate 310 includes a non-uniform array of openings 320 having a variety of different shapes, orientations, and/or central locations. For example, opening 322 has a circular shape that is different from the shapes of the openings arranged along the vertical axis A and the shapes of the openings arranged along the horizontal axis 1. For example, opening 322 has a circular shape, while opening 324 has a triangular shape and opening 325 has a rectangular shape. Moreover, a center of opening 322 deviates from its closest horizontal axis 1 and vertical axis A by a different amount than the centers of the openings aligned along horizontal axis 1 and vertical axes A, respectively.

Additionally, or alternatively, the array of openings 320 may have the same shape, but have different orientations, sizes, and/or have different offsets from respective horizontal (1, 2, 3, . . . j) and/or vertical (A, B, C, . . . i) axes as compared to adjacent openings. For example, opening 326 has a similar shape as adjacent opening 328. However, the opening 326 has a different orientation and is smaller than adjacent opening 328. Additionally, a center of opening 326 has a small deviation from the horizontal axis 3, while the center of opening 328 has a larger deviation from the horizontal axis. Further, the center of opening 326 has a greater deviation from the closest vertical axis C as compared to the deviation of the center of opening 328 to its closest vertical axis B.

By adjusting the size, shape, orientation and locations of each opening of the array of openings 320, the webbing W between adjacent openings also is adjusted. That is, the distance between edges of two adjacent openings is dependent upon sizes/radii, shapes, orientations and locations of adjacent openings. Thus, a non-uniform array of openings 220, 320 depicted in FIGS. 2A and 2B having non-uniform sizes/radii, shapes, alignments, and/or orientations directly affects the webbing W between each opening. Consequently, non-uniform sizes/radii, shapes, alignments, and/or orientations of adjacent openings results in non-uniform webbing W between adjacent openings. For example, a non-uniform array of openings 320 may result in a length of a webbing $W_1$ between a first opening 324 and an adjacent opening 322 to be different from a length of a second webbing $W_2$ between the first opening 324 and a second adjacent opening 325. In some implementations, the length of webbing $W_1$ between the first opening 324 and the adjacent opening 325 is different from each length of each webbing W between the first opening 324 and all other adjacent openings. Accordingly, configuring the non-uniform array of openings 320 to have non-uniform sizes/radii, shapes, orientations, alignments, and locations may also provide a non-uniform webbing W.

Based on the pattern of the non-uniform array of openings 220, 320, the non-uniform air vent 200, 300 can be tuned to attenuate a desired EMI frequency and/or frequency band and admit a desired amount of cooling air to a particular chassis. For example, the non-uniform array of openings 220, 320 may function as a plurality of capacitors, impacting the overall capacitance of the plate 210, 310. The webbing W may function as inductors, impacting the overall inductance of the plate 210, 310. Consequently, the array of openings 220, 320 of different (non-uniform) sizes/radii, shapes, orientations, and/or locations can tune the capacitance and inductance of the air vent 200, 300 to achieve better EMI shielding in certain frequency ranges, while keeping the same air ventilation rate as an air vent 100 corresponding to the particular chassis with a uniform pattern for the array of openings 120 having substantially uniform sizes and aligned center locations, as depicted in FIGS. 1A-1C.

The parameters for the non-uniform array of openings 220, 320 of the non-uniform air vent 200, 300 may be based on the design parameters of the uniform air vent 100 (e.g., plate dimensions, percent opening Ω, opening size/radius $R_u$, opening spacing/webbing $W_u$, number of openings $N_u$, desired EMI frequency/frequency band or signal emission to be attenuated SE, plate thickness T etc.). That is, an area of each opening 220, 320 can be scaled between a desired minimum area and a desired maximum area to meet the design parameters. Additionally, the number of openings N and minimum webbing $W_{min}$ and maximum webbing $W_{max}$ can be selected to meet a desired percent opening Ω of the air vent 200, 300 for cooling and attenuating EMI for the particular chassis. For example, the radius R of a circular opening is directly proportional to the area of the opening (e.g., Area=2πR). Thus, scaling the radius R of the non-uniform array of openings depicted in FIG. 2A, for example, also scales their area. For example, a desired minimum radius $R_{min}$ and a desired maximum radius $R_{max}$ for a non-uniform array of openings 220 may be set based on a scaling factor s and the radius $R_u$ for each opening $120_{ij}$ of the uniform array of openings 120 of the uniform air vent 100 of FIG. 1C such that:

$$R_{max}=(1+s/100)*R_u$$

$$R_{min}=(1-s/100)*R_u$$

Each opening $220_{ij}$ may have a radii $R_{ij}$ such that $R_{max} \geq R_{ij} \geq R_{min}$. Meanwhile, the total percent opening Ω in the non-uniform arrangement is kept equal to or greater than the percentage opening $Ω_u$ in a uniform arrangement.

Figure 3A:
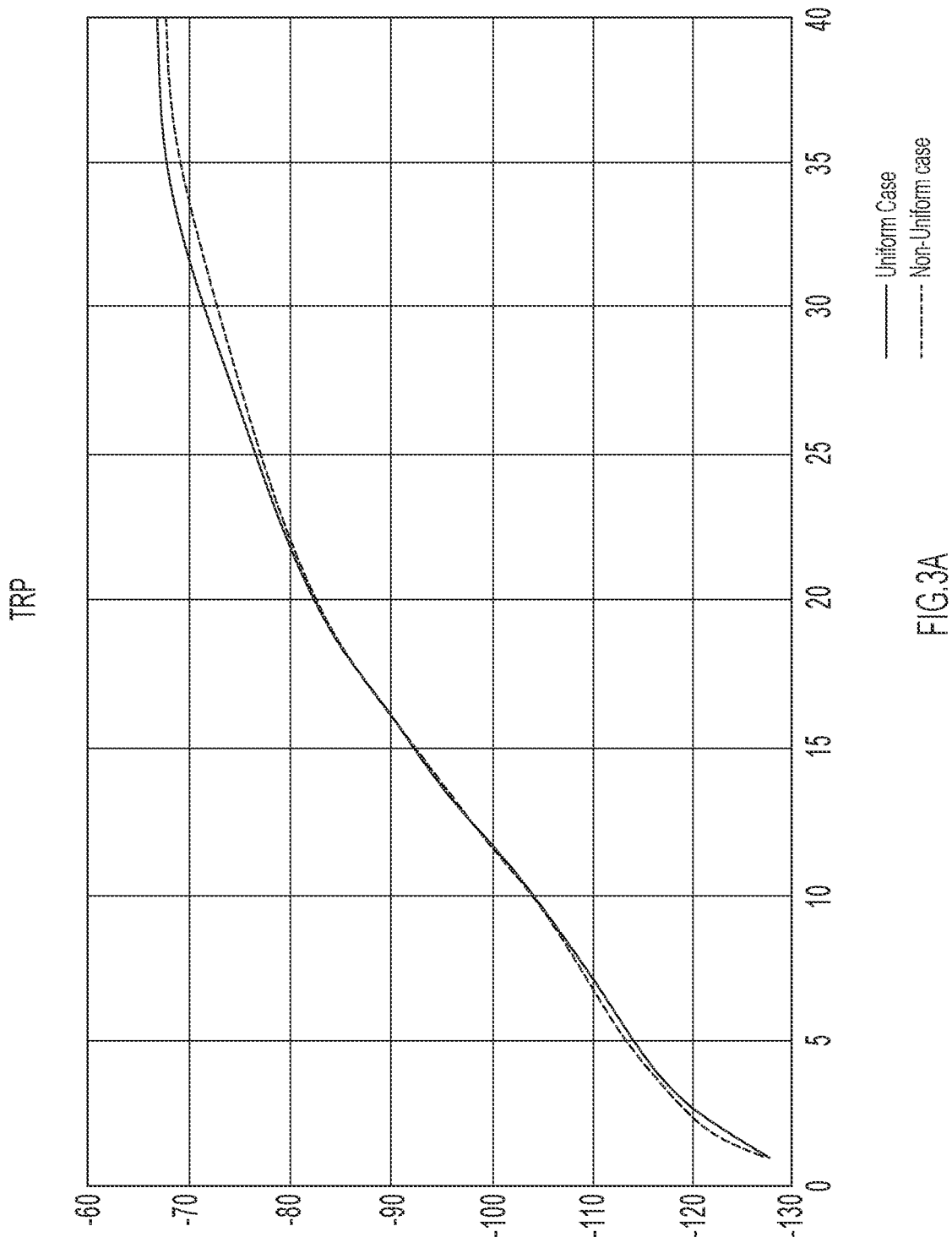
FIGS. 3A and 3B are graphs illustrating the difference in EMI shielding between a conventional, uniform air vent and a non-uniform air vent, according to an example embodiment.
Figure 3B:
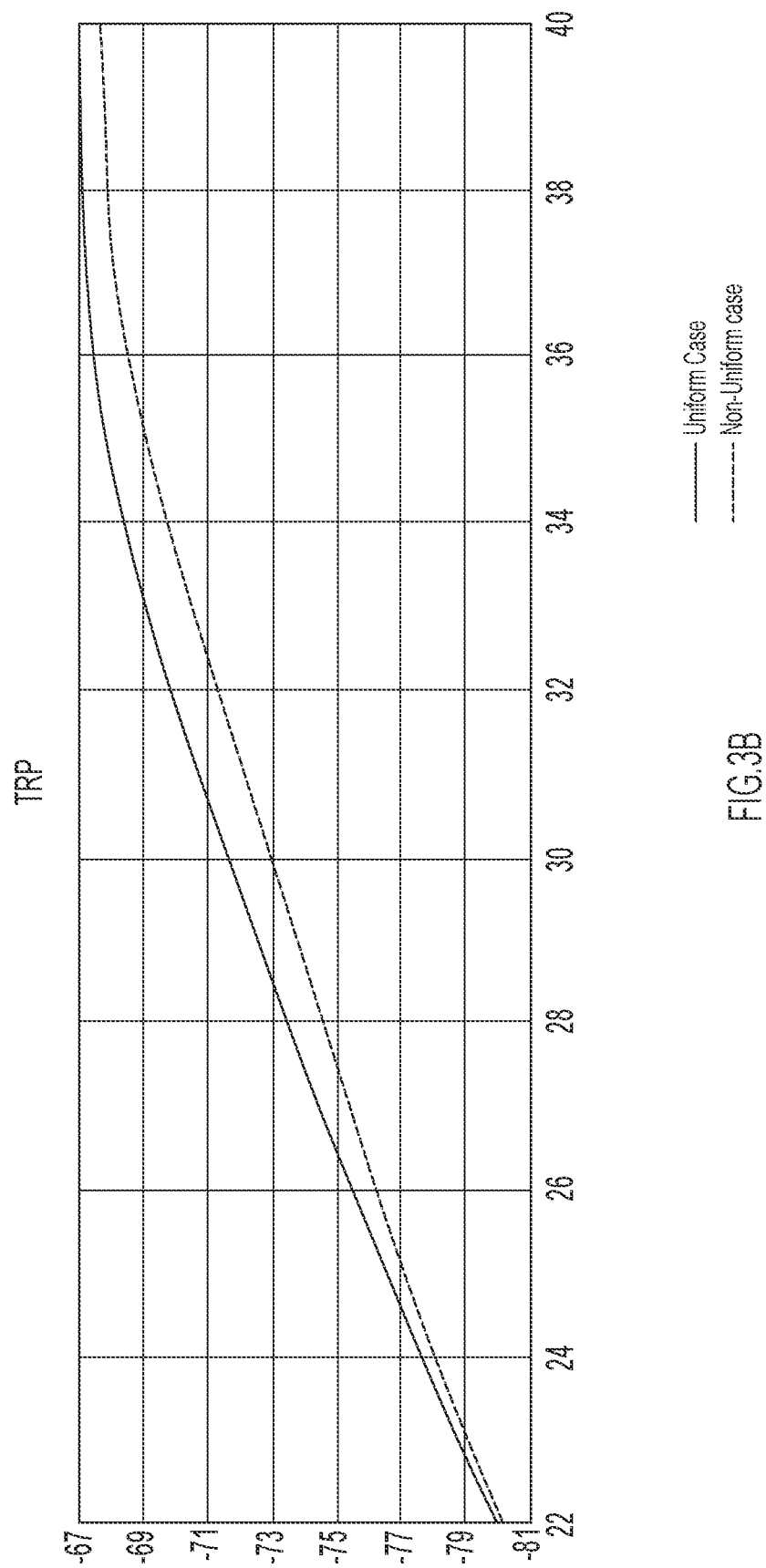

Referring to FIGS. 3A and 3B, plots are shown of total radiated power (TRP) measured in decibels (dB) versus frequency (GHz) comparing a non-uniform air vent with a non-uniform array of openings and a uniform air vent with the uniform array of openings. Generally, an air vent is desirable that radiates less power (e.g., EMI) from the chassis while allowing a determined amount of cooling air into the chassis.

As shown in FIG. 3B, a non-uniform air vent provides better shielding effectiveness (SE) in particular frequency ranges (e.g., about 22-40 GHz). Because the non-uniform air vent has substantially the same percent opening Ω as a uniform air vent, there is little to no impact on the flow of cooling air, as compared to a uniform air vent. That is, for a given percentage of opening Ω, the non-uniform air vent achieves better EMI shielding without impacting a flow of cooling air by the non-uniform array of openings and/or the non-uniform webbing W, as compared to EMI performance of the air vent (depicted in FIG. 1C) with uniform opening alignment/shape and webbing. Additionally or alternatively, the same EMI performance may be achieved with an overall larger percentage of opening Ω for the air vent having a non-uniform array of openings as compared to the uniform air vent.

Because the sizes and locations of openings 220, 320 depicted in FIGS. 2A and 2B are non-uniform, there are numerous potential patterns of opening sizes and center locations combinations that attenuate different frequencies of EMI. Not all patterns will achieve a desired EMI attenuation/shielding effectiveness. Based on simulations, some combinations may have better EMI attenuation/shielding effectiveness in certain frequency ranges. A database can store various non-uniform patterns for air vents and simulated total radiated powers (TRPs) corresponding to the various non-uniform patterns. A designer user can reference the database to find a non-uniform arrangement of openings for an air vent that will attenuate EMI in a desired frequency band and meet or exceed a desired percent opening Ω for a particular chassis.

FIGS. 4A and 4B are example tables comprising example air vent parameter data. FIG. 4A is an example of a table storing data corresponding to air vent opening patterns. For example, the data includes a pattern ID and corresponding air vent parameters such as a percent opening Ω, a minimum webbing W, a number of openings N, an air vent plate thickness T, an opening minimum radius $R_{min}$, an opening maximum radius $R_{max}$, a location of each opening O and a radius R of each opening. Cartesian coordinates may define the location of the center of each opening. The Cartesian coordinates may be correspond to an x-axis aligned along a length of the air vent plate 210, 310 and a y-axis aligned along a width of the air vent plate 210, 310 (as depicted in FIGS. 2A and 2B). The openings may be arranged in any number of columns i and any number of rows j along the plate 210, 310. Each opening may be designated by its corresponding column i and any row j. In some implementations, the table further includes a shape, length, height, width, and/or other dimension or characteristic of the plate 210, 310. The table also includes parameters (percent opening $\Omega_u$, a minimum webbing $W_u$, a number of openings N, an air vent plate thickness T, uniform opening radius $R_u$, a location of each opening O and the radius $R_u$ of each opening) corresponding to an air vent having a uniform opening arrangement for a particular chassis for comparison to the non-uniform air vent opening patterns.

FIG. 4B is an example of a table storing data regarding the air vent opening patterns and parameters (from the table in 4A) and simulated signal emission $SE(f_n)$ corresponding to those opening patterns. For example, for each the pattern, the table includes a pattern ID, a percent opening $\Omega$, a minimum webbing W, a number of openings N, air vent plate thickness T, opening minimum radius $R_{min}$, opening maximum radius $R_{max}$, x-y coordinates for the center of each opening, the radius of each opening, and signal emission SE for one or more frequencies $f_n$. The signal emission may be measured in decibels.

In some implementations, the tables depicted in FIGS. 4A and 4B may be combined into a single table. In some implementations, artificial intelligence (AI), and/or machine learning (ML) techniques may be used to determine the plurality of non-uniform opening patterns for a plurality of air vents. In some implementations, the AI/ML techniques can randomly set radii and locations of the openings for the air vent plate, and then calculate the EMI signal emission SE for a plurality of frequency using computer implemented 3D electromagnetic simulation tools. The table(s) of non-uniform air vent patterns and parameters may be stored in a database. In some implementations, dimensions (e.g., length, width, thickness, shape. etc.) for an air vent may also be stored with the patterns in the table(s).

Using the table(s) of FIGS. 4A and 4B, an opening pattern for an air vent may be retrieved for a particular chassis based on design parameters such as thermal properties (e.g., heat output or power usage), an operating frequency, and/or an EMI frequency range to be attenuated for the particular chassis. For example, a user may retrieve a desired percentage of opening $\Omega$ and a desired EMI frequency band to attenuate for the particular chassis. Alternatively, a user may retrieve a desired amount of airflow and an operating frequency of one or more electrical components disposed in the chassis to determine a particular percentage of opening $\Omega$ and a particular EMI frequency band(s) to attenuate for the particular chassis. Regardless of how the percentage of opening $\Omega$ and EMI frequency bands to attenuate are retrieved, those parameters are compared to a database storing the table(s) of FIGS. 4A and 4B to determine an air vent plate opening pattern or arrangement that meets EMI shielding and thermal properties for the particular chassis. That is, an air vent plate is selected having a non-uniform opening pattern that has the lowest signal emission at a desired EMI frequency and a highest percent opening $\Omega$ among the plurality of air vent plate opening patterns stored in the database. In some implementations, the percent opening $\Omega$ of the selected non-uniform opening pattern is equal to or greater than a percent opening $\Omega$ of a similar air vent having a uniform opening arrangement. In some implementations, dimensions (e.g., length, width, thickness, shape. etc.) for the air vent may also be considered and compared to the opening patterns in the table(s).

Figure 5A:
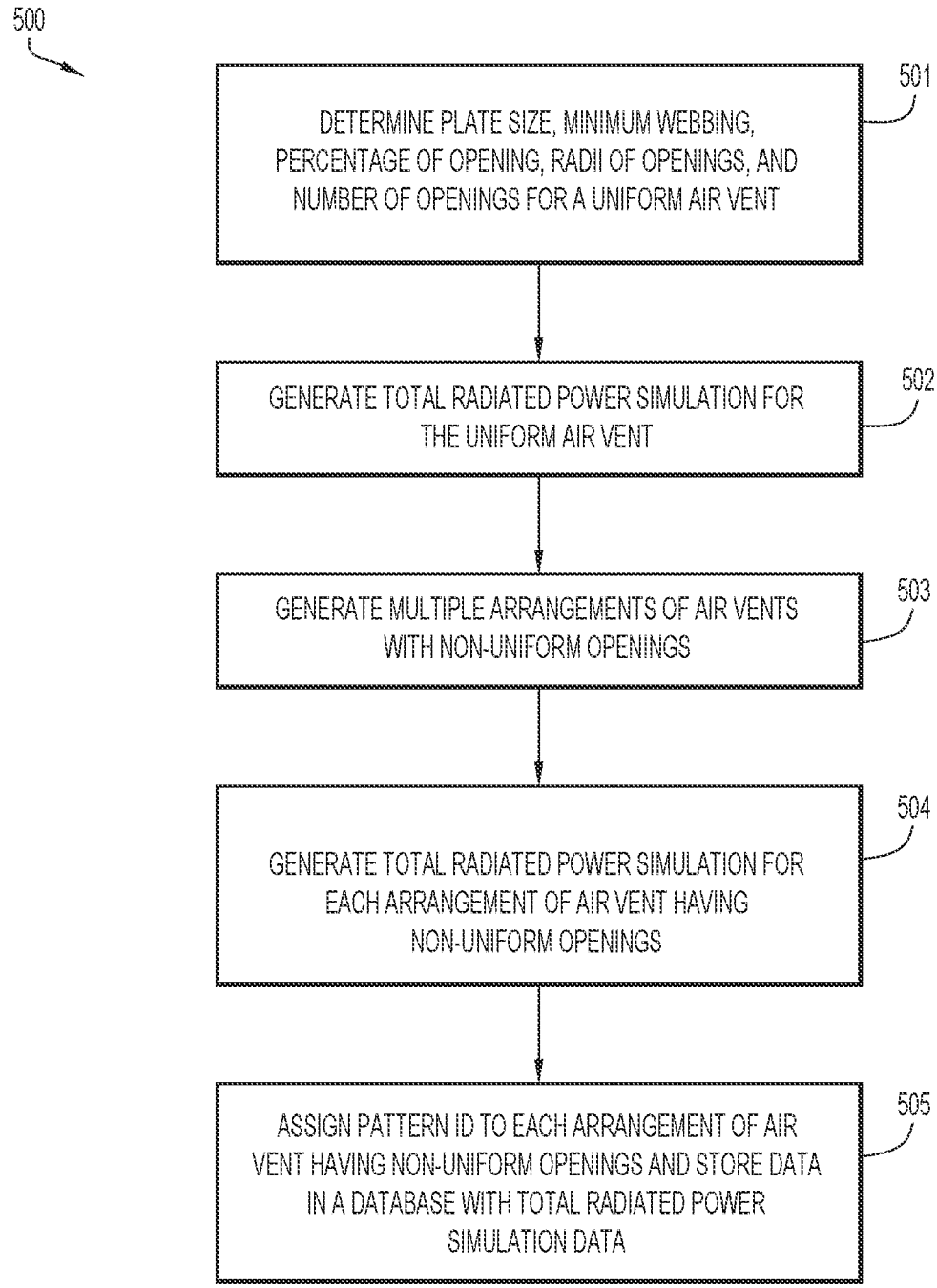
FIG. 5A is a flowchart illustrating a method of creating a database of air vent opening patterns, according to an embodiment.

Now referring to FIG. 5A, a flowchart for a method 500 of generating, via a processor, the data for tables of FIGS. 4A and 4B is shown. The method includes determining a uniform air vent pattern for a particular chassis including: plate size (e.g., length, width, thickness, shape. etc.), minimum webbing $W_{min}$, percentage of opening $\Omega$, radius $R_u$ of openings, and number of openings N in operation 501; generating a simulation of the total radiated power data for the uniform air vent in operation 502; generating a plurality of arrangements for non-uniform openings of air vents in operation 503; generating a total radiated power (TRP) simulation for each arrangement of the plurality of arrangements for non-uniform openings of air vents in operation 504; and assigning a pattern ID to each arrangement of air vents having non-uniform openings and storing the data with the total radiated power simulation data in a database in operation 505.

In operation 503, the plurality of arrangements for the particular chassis may be configured in the manner described above with reference to FIGS. 2A and 2B. In some implementations, the patterns may be generated by randomly setting the parameters for the air vent (e.g., radii $R_i$, [where $R_{max} \geq R_i \geq R_{min}$], percentage of opening $\Omega$, x-y coordinates for the center of each opening, plate thickness and/or webbing W).

In operation 504, the TRP simulation data may be a simulated signal emission (measured in decibels) from the air vent for a plurality of frequencies. The frequencies may range from 500 MHz-50 GHz.

Figure 5B:
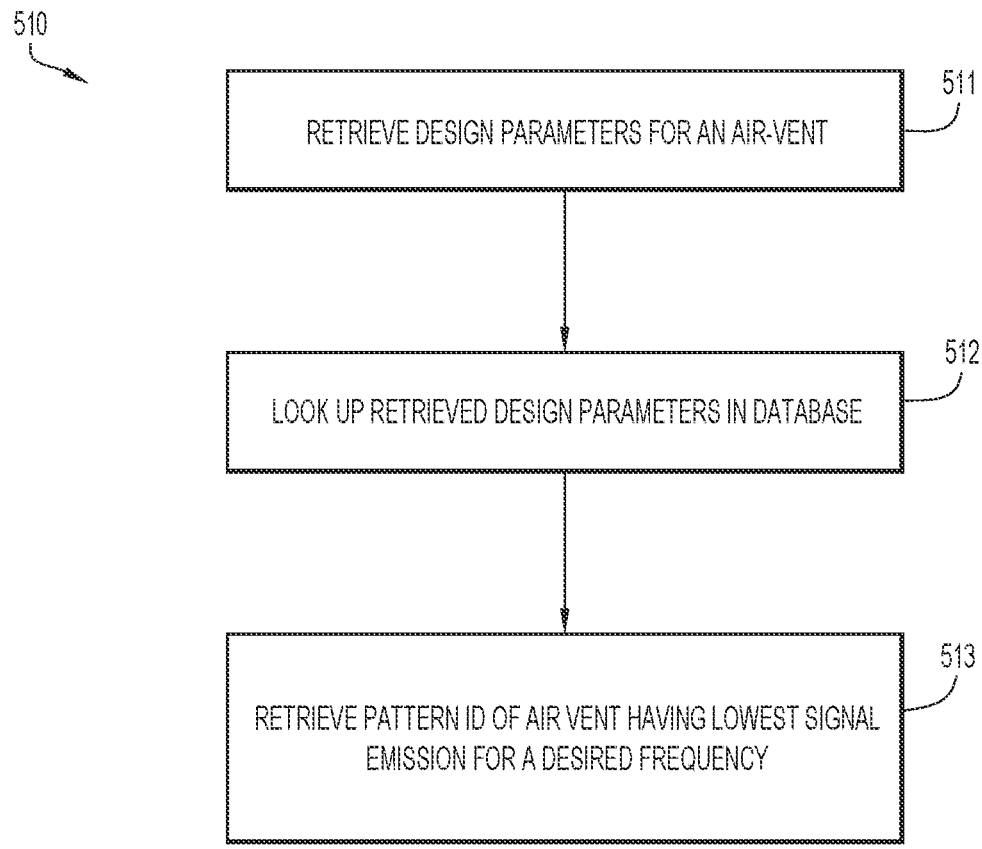
FIG. 5B is a flowchart illustrating a method of determining an opening pattern for an air vent, according to an embodiment.

Now referring to FIG. 5B, a flowchart depicting a method 510 for determining an opening pattern for an air vent for a particular chassis is shown. The method 510 includes retrieving design parameters for an air vent based on a particular chassis, in operation 511; looking up the retrieved design parameter in a database, in operation 512; and retrieving a pattern ID of an air vent having a lowest signal emission for a desired frequency, in operation 513.

Figure 5C:
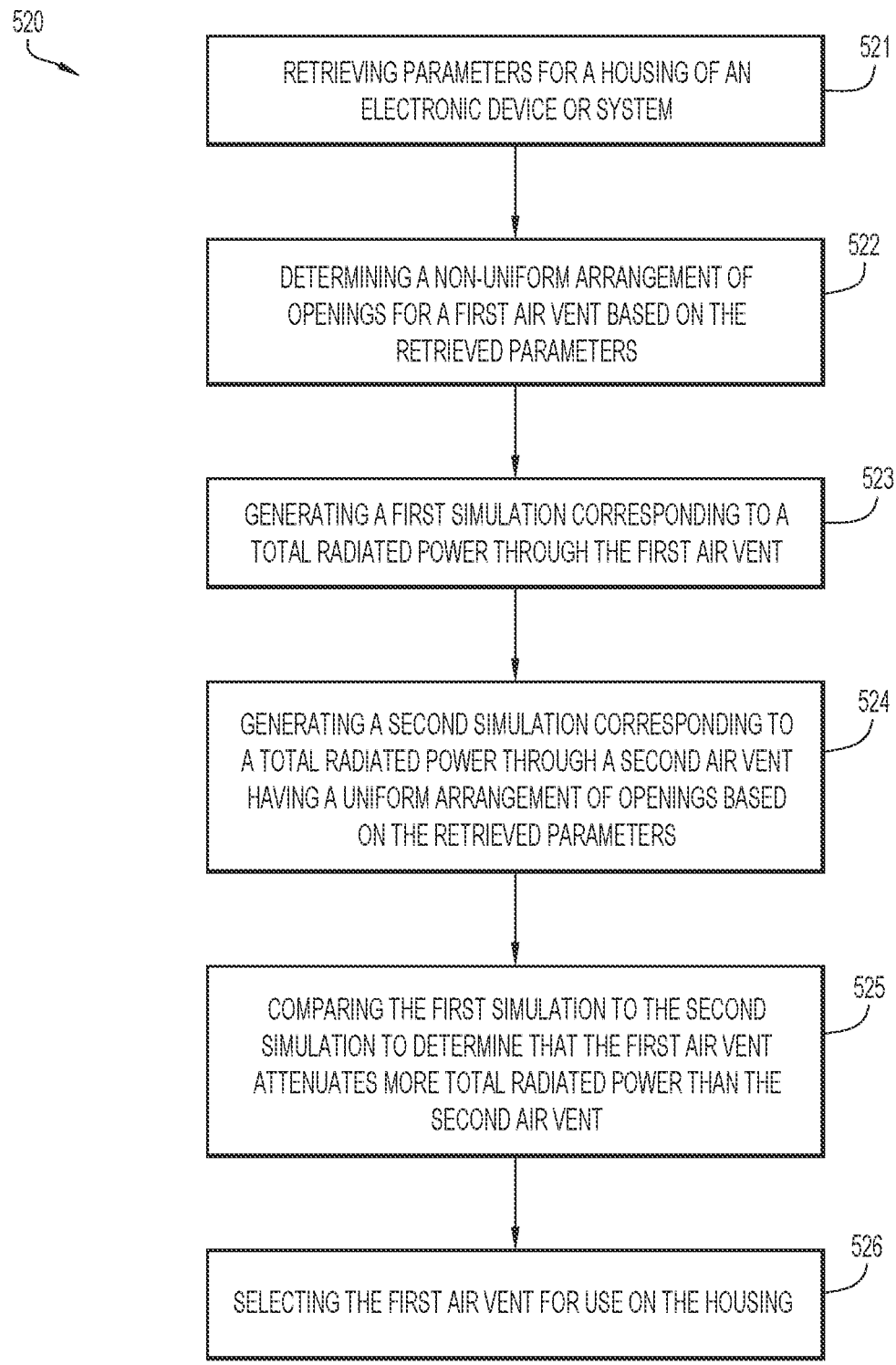
FIG. 5C is a flowchart illustrating a method of selecting an air vent for a housing, according to an embodiment.

Now referring to FIG. 5C, a flowchart depicting a computer-implemented method 520 for determining an opening pattern for an air vent for a particular chassis is shown. The method 520 includes retrieving parameters for a housing of an electronic device or system, in operation 521; determining a non-uniform arrangement of openings for a first air vent based on the retrieved parameters, in operation 522; generating a first simulation corresponding to a total radiated power through the first air vent, in operation 523; generating a second simulation corresponding to a total radiated power through a second air vent having a uniform arrangement of openings based on the retrieved parameters, in operation 524; comparing the first simulation to the second simulation to determine that the first air vent attenuates more total radiated power than the second air vent, in operation 525; and selecting the first air vent for use on the housing, in operation 526. The parameters for the housing include at least one of: a signal emission frequency, a percent opening, a minimum opening radius, a maximum opening radius, a minimum webbing length, a number of openings, a panel length, a panel width, and a panel thickness.

In operation 522, determining the non-uniform arrangement of openings comprises at least one of: (1) setting non-uniform lengths for radii of openings of the non-uniform arrangement of openings such that each radius of each opening is different from radii of adjacent openings; (2) setting each center of each opening to be vertically and horizontally misaligned from centers of adjacent openings; and (3) setting a first shape and a first orientation of a first opening and setting a second shape and a second orientation of an adjacent opening, wherein the first shape is different from the second shape and/or the first orientation is different from the second orientation.

In some implementations, the method may further include: in response to determining that the first air vent attenuates less total radiated power at in a particular frequency range than the second air vent, determining a second non-uniform arrangement of openings for a third air vent based on the retrieved parameters; generating a third simulation corresponding to a total radiated power through the third air vent; comparing the second simulation to the third simulation to determine that the third air vent attenuates more total radiated power in a particular frequency range than the second air vent; and in response to comparing the second simulation to the third simulation, selecting the third air vent for use on the housing.

Additionally or alternatively, the AI/ML techniques can determine an opening arrangement of an air vent for meeting desired EMI shielding and airflow. To train an AI/ML model, parameters like opening shapes, sizes and location, plate thickness, material etc. are provided to the AI/ML model of EMI shielding and airflow properties. To generate this data, the process of model creation may be automated using a suitable computation platform and importing derived parameters into an electromagnetic simulation software. 3D electromagnetic simulation tools allow parametrization of most (if not all) of the parameters listed above. The model may provide rapid results for determining EMI shielding in the frequency range of 1-40 GHz. These simulations enable calculation of the shielding effectiveness data to any of the parameters selected for designing the non-uniform air vent.

Figure 6:
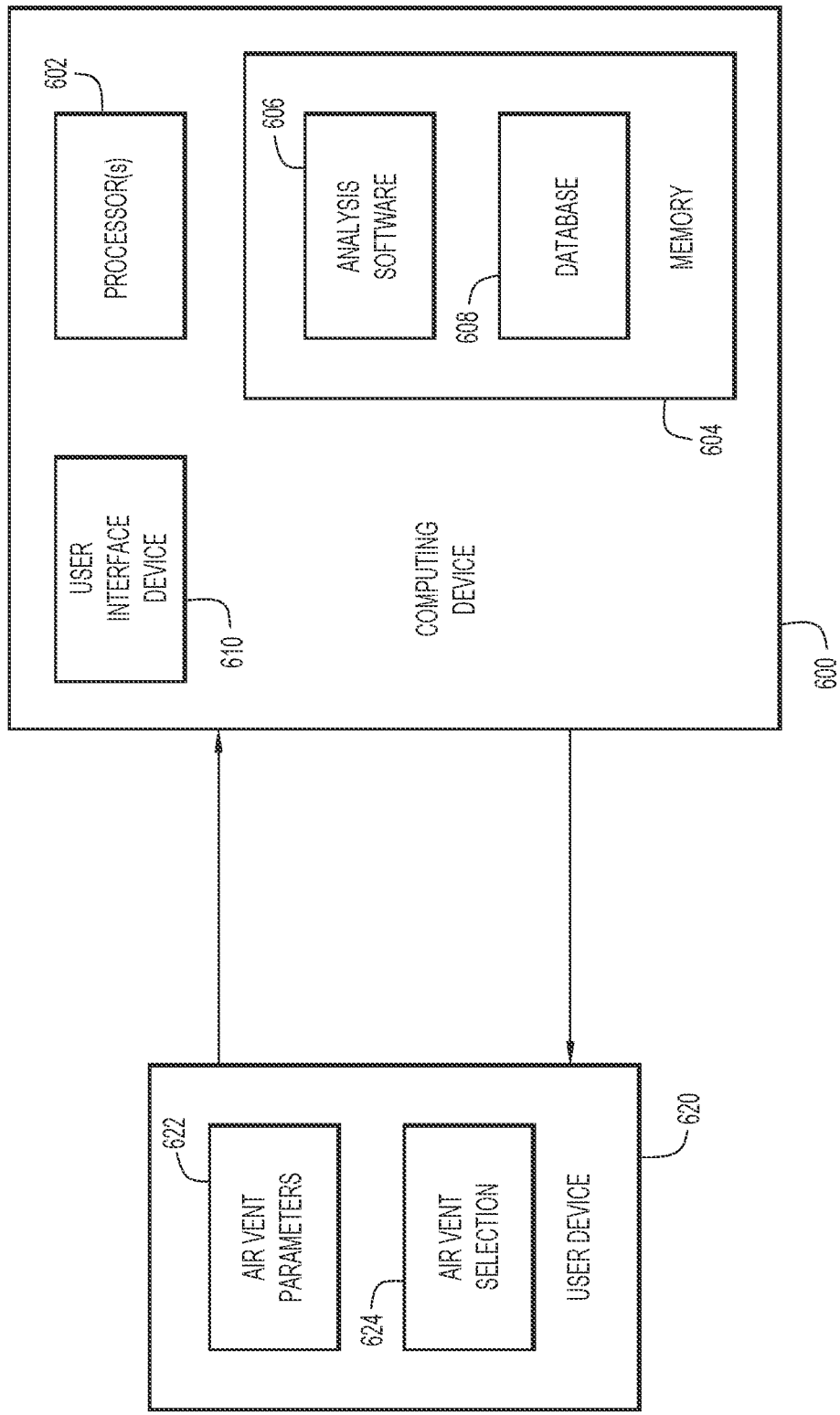
FIG. 6 illustrates a hardware block diagram of a computing device, according to an embodiment.

Now referring to FIG. 6, FIG. 6 illustrates a hardware block diagram of a computing device or system 600 that may perform functions associated with operations discussed herein in connection with the techniques depicted in FIGS. 5A-5C. In various embodiments, a computing device or apparatus, such as computing device 600 or any combination of computing devices 600, may be configured as any entity/entities as discussed for the techniques depicted in connection with FIGS. 5A-5C in order to perform operations of the various techniques discussed herein.

In at least one embodiment, the computing device 600 may be any apparatus that may include one or more processor(s) 602, one or more memory element(s) 604 storing analysis software 606 and a database 608, and user interface device 610. In various embodiments, instructions associated with logic for computing device 600 can overlap in any manner and are not limited to the specific allocation of instructions and/or operations described herein. A user device 620 may communicate with the computing device 600. The user device 620 may transmit air vent parameters 622 to the computing device 600 and receive an air vent selection 624 from the computing device 600. In some implementations, a user may input the air vent parameter 622 and receive the air vent selection directly from the computing device 600 via the user interface device 610.

In at least one embodiment, processor(s) 602 is/are at least one hardware processor configured to execute various tasks, operations and/or functions for computing device 600 as described herein according to software and/or instructions configured for computing device 600. Processor(s) 602 (e.g., a hardware processor) can execute any type of instructions associated with data to achieve the operations detailed herein. In one example, processor(s) 602 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 604, and/or database 608 is/are configured to store analysis software 606, data, information, software, and/or instructions associated with computing device 600, and/or logic configured for memory element(s) 604 and/or database 608. For example, any logic described herein (e.g., analysis software 606, parameter tables of FIGS. 4A and 4B) can, in various embodiments, be stored for computing device 600 using any combination of memory element(s) 604 and/or database 608. Note that in some embodiments, database 608 can be consolidated with memory element(s) 604 (or vice versa), or can overlap/exist in any other suitable manner.

The user interface device 610 allows for input and output of data (e.g., air vent parameters 622 and air vent selection 624) and/or information with other entities that may be connected to computing device 600. For example, user interface device 610 may be a keyboard, keypad, a touch screen, and/or any other suitable input and/or output device now known or hereafter developed. In some instances, external devices can interface with the user interface device 610 and include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, the memory element(s) 604 may include (store or be encoded with) control logic that can include instructions that, when executed, cause processor(s) 602 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof, and/or the like to facilitate various operations for embodiments described herein.

The programs described herein (e.g., control logic and analysis software 606) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 604 and/or database 608 can store data, software, code, instructions (e.g., processor instructions), logic, parameters, combinations thereof, and/or the like used for operations described herein. This includes memory element(s) 604 and/or database 608 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

In some aspects, an air vent is provided that includes: a plate; and a non-uniform array of openings extending through a thickness of the plate, the non-uniform array of openings arranged to admit a flow of cooling air through the plate; wherein the plate and the non-uniform array of openings are arranged to attenuate electromagnetic interference (EMI) emitted through the plate.

In some aspects, in the air vent, radii of openings of the non-uniform array of openings have non-uniform lengths.

In some aspects, the techniques described herein relate to an air vent, wherein a first opening of the non-uniform array of openings has a first radius of a first length that is different than a second radius having a second length of an a second opening adjacent to the first opening.

In some aspects, the techniques described herein relate to an air vent, wherein centers of openings of the non-uniform array of openings are non-uniformly arranged.

In some aspects, the techniques described herein relate to an air vent, wherein the non-uniform array of openings is defined by a plurality of openings extending along a plurality of rows and columns, and a center of each opening of the plurality of openings is vertically offset from centers of at least two adjacent openings disposed within a same row.

In some aspects, the techniques described herein relate to an air vent, wherein the non-uniform array of openings is defined by a plurality of openings extending along a plurality of rows and columns, and a center of each opening of the plurality of openings is horizontally offset from centers of at least two adjacent openings disposed within a same column.

In some aspects, the techniques described herein relate to an air vent, wherein the non-uniform array of openings includes a plurality of openings having non-uniform shapes.

In some aspects, the techniques described herein relate to an air vent, wherein the plurality of openings having non-uniform orientations.

In some aspects, the techniques described herein relate to an air vent, wherein: a first opening of the non-uniform array of openings includes a first shape and a first orientation; a second opening adjacent to the first opening has a second shape and a second orientation; and the first shape is different from the second shape, or the first orientation is different from the second orientation.

In some aspects, the techniques described herein relate to an air vent, further including webbings between each opening of the non-uniform array of openings, the webbings being substantially non-uniform.

In some aspects, the techniques described herein relate to a computer-implemented method including: retrieving parameters for a housing of an electronic device or system; determining a non-uniform arrangement of openings for a first air vent based on the parameters; generating a first simulation corresponding to a total radiated power through the first air vent; generating a second simulation corresponding to a total radiated power through a second air vent having a uniform arrangement of openings based on the parameters; comparing the first simulation to the second simulation to determine that the first air vent attenuates more total radiated power than the second air vent; and selecting the first air vent for use on the housing.

In some aspects, the techniques described herein relate to a computer-implemented method, wherein the parameters for the housing include at least one of: a signal emission frequency; a percent opening; a minimum opening radius; a maximum opening radius; a minimum webbing length; a number of openings; a panel length; a panel width; and a panel thickness.

In some aspects, the techniques described herein relate to a computer-implemented method, wherein determining the non-uniform arrangement of openings includes at least one of: setting non-uniform lengths for radii of openings of the non-uniform arrangement of openings such that each radius of each opening is different from radii of adjacent openings; setting each center of each opening to be vertically and horizontally misaligned from centers of adjacent openings; and setting a first shape and a first orientation of a first opening and setting a second shape and a second orientation of an adjacent opening, wherein the first shape is different from the second shape and/or the first orientation is different from the second orientation.

In some aspects, the techniques described herein relate to a computer-implemented method, further including: in response to determining that the first air vent attenuates less total radiated power at in a particular frequency range than the second air vent, determining a second non-uniform arrangement of openings for a third air vent based on the parameters; generating a third simulation corresponding to a total radiated power through the third air vent; comparing the second simulation to the third simulation to determine that the third air vent attenuates more total radiated power in the particular frequency range than the second air vent; and in response to comparing the second simulation to the third simulation, selecting the third air vent for use on the housing.

In some aspects, the techniques described herein relate to a system including: a chassis having one or more electrical components; and a plate configured to cover at least a portion of the chassis, the plate having a non-uniform array of openings through a thickness of the plate, the non-uniform array of openings arranged to admit a flow of cooling air and attenuating electromagnetic interference (EMI) through the plate; wherein each opening of the non-uniform array of openings is defined by one or more parameters, and at least one parameter for each opening is different than at least one parameter of an adjacent opening.

In some aspects, the techniques described herein relate to a system, wherein the one or more parameters include: a radius a corresponding opening; a shape the corresponding opening; an orientation of the corresponding opening; and distances between the corresponding opening and adjacent openings.

In some aspects, the techniques described herein relate to a system, wherein webbing between openings of the non-uniform array of openings defines an inductance of the plate and the non-uniform array of openings defines a capacitance of the plate.

In some aspects, the techniques described herein relate to a system, wherein the capacitance and the inductance of the plate are tuned to attenuate a particular frequency and/or a frequency range of EMI.

In some aspects, the techniques described herein relate to a system, wherein the non-uniform array of openings are arranged in a plurality of columns and rows, each row having a horizontal axis, and each column having a vertical axis.

In some aspects, the techniques described herein relate to a system, wherein centers of the openings of the non-uniform array of openings have a non-uniform, vertical offset from the horizontal axis and a non-uniform, horizontal offsets from the vertical axis.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

It is also to be understood that the air vent 200, 300 described herein, or portions thereof, may be fabricated from any suitable metal or combination of metals (e.g., alloys).

Reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as "above", "below", "upper", "lower", "top", "bottom", "left," "right," "front," "rear," "side," "height," "length," "width," "interior," "exterior," "inner," "outer" or other similar terms merely describe points of reference and do not limit the present invention to any particular orientation or configuration. When used to describe a range of dimensions and/or other characteristics (e.g., time, pressure, temperature, distance, etc.) of an element, operations, conditions, etc. the phrase "between X and Y" represents a range that includes X and Y.

Further, the term "exemplary" is used herein to describe an example or illustration. Any embodiment described herein as exemplary is not to be construed as a preferred or advantageous embodiment, but rather as one example or illustration of a possible embodiment.

Further, the present disclosure may repeat reference numerals and/or letters in the various examples. This repetition is for the purpose of simplicity and clarity, and does not in itself dictate a relationship between the various embodiments and/or configurations discussed.

When used herein, the term "comprises" and its derivations (such as "comprising", "including," "containing," etc.) should not be understood in an excluding sense, that is, these terms should not be interpreted as excluding the possibility that what is described and defined may include further elements, steps, etc. Meanwhile, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the similar terms, such as, but not limited to, "about," "around," and "substantially."

As used herein, unless expressly stated to the contrary, use of the phrase "at least one of", "one or more of", "and/or", and variations thereof are open-ended expressions that are both conjunctive and disjunctive in operation for any and all possible combination of the associated listed items. For example, each of the expressions "at least one of X, Y and Z", "at least one of X, Y or Z", "one or more of X, Y and Z", "one or more of X, Y or Z" and "X, Y and/or Z" can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z. Further as referred to herein, "at least one of" and "one or more of" can be represented using the "(s)" nomenclature (e.g., one or more element(s)).

Additionally, unless expressly stated to the contrary, the terms "first", "second", "third", etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, "first X" and "second X" are intended to designate two "X" elements that are not necessarily limited by any order, rank, importance, temporal sequence, or hierarchy of the two elements.

What is claimed is:

1. An air vent comprising:
a plate; and
a non-uniform array of openings extending through a thickness of the plate, the non-uniform array of openings arranged to admit a flow of cooling air through the plate, and the non-uniform array of openings comprising a plurality of rows and a plurality of columns;
wherein a first opening of the non-uniform array of openings is a part of a row of the plurality of rows and a part of a column of the plurality of columns, a first center of the first opening is aligned with a first reference axis extending in overlap with a remaining plurality of second openings of the non-uniform array of openings at the row of the plurality of rows, a second center of each second opening of the remaining plurality of second openings is offset from the first reference axis, the first center of the first opening is aligned with a second reference axis extending in overlap with a remaining plurality of third openings of the non-uniform array of openings at the column of the plurality of columns, a third center of each third opening of the remaining plurality of third openings is offset from the second reference axis, and the second centers of the remaining plurality of second openings are positioned at opposite sides of the first center of the first opening so that the first reference axis extends between the second centers and/or the third centers of the remaining plurality of third openings are positioned at additional opposite sides of the first center of the first opening so that the second reference axis extends between the third centers, such that the plate and the non-uniform array of openings are arranged to attenuate electromagnetic interference (EMI) emitted through the plate.

2. The air vent of claim 1, wherein radii of the first opening, of the remaining plurality of second openings, and of the remaining plurality of third openings of the non-uniform array of openings have non-uniform lengths.

3. The air vent of claim 2, wherein radii of all immediately adjacent openings of the non-uniform array of openings have different lengths.

4. The air vent of claim 1, wherein the remaining plurality of second openings does not comprise any of the third openings of the remaining plurality of third openings.

5. The air vent of claim 1, wherein the first opening, the remaining plurality of second openings, and the remaining plurality of third openings of the non-uniform array of openings have non-uniform shapes.

6. The air vent of claim 1, wherein the first opening, the remaining plurality of second openings, and the remaining plurality of third openings of the non-uniform array of openings have non-uniform orientations.

7. The air vent of claim 1, wherein the first opening, the remaining plurality of second openings, and the remaining plurality of third openings of the non-uniform array of openings comprise a circular shape.

8. The air vent of claim 1, further comprising webbings between immediately adjacent openings of the non-uniform array of openings, the webbings being substantially non-uniform.

9. The air vent of claim 1, wherein the non-uniform array of openings is arranged based on parameters for a housing, wherein the parameters for the housing comprise at least one of:
a signal emission frequency;
a percent opening;
a minimum opening radius;
a maximum opening radius;
a minimum webbing length;
a number of the non-uniform array of openings;
a panel length;
a panel width; and
a panel thickness.

10. The air vent of claim 1, wherein orientations of all immediately adjacent openings of the non-uniform array of openings are different.

11. A system comprising:
a chassis having one or more electrical components; and
a plate configured to cover at least a portion of the chassis, the plate having a non-uniform array of openings through a thickness of the plate, the non-uniform array of openings arranged to admit a flow of cooling air and attenuating electromagnetic interference (EMI) through the plate, and the non-uniform array of openings forms a plurality of rows and a plurality of columns;
wherein each opening of the non-uniform array of openings comprises a respective radius, and all immediately adjacent openings of the non-uniform array of openings comprise different respective radii;
wherein a first opening of the non-uniform array of openings is a part of a row of the plurality of rows and a part of a column of the plurality of columns, a first center of the first opening is aligned with a first reference axis extending in overlap with a remaining plurality of second openings of the non-uniform array of openings at the row of the plurality of rows, a second center of each second opening of the remaining plurality of second openings is offset from the first reference axis, the first center of the first opening is aligned with a second reference axis extending in overlap with a remaining plurality of third openings of the non-uniform array of openings at the column of the plurality of columns, a third center of each third opening of the remaining plurality of third openings is offset from the second reference axis, and the second centers of the remaining plurality of second openings are positioned at opposite sides of the first center of the first opening such that the first reference axis extends between the second centers and/or the third centers of the remaining plurality of third openings are positioned at additional opposite sides of the first center of the first opening such that the second reference axis extends between the third centers.

12. The system of claim 11, wherein webbing between the openings of the non-uniform array of openings defines an inductance of the plate and the non-uniform array of openings defines a capacitance of the plate.

13. The system of claim 11, wherein each row of the plurality of rows has a horizontal axis, each column of the plurality of columns has a vertical axis, and the centers of the openings of the non-uniform array of openings have a non-uniform, vertical offset from the horizontal axis and a non-uniform, horizontal offset from the vertical axis.

14. The system of claim 11, wherein respective webbings between the openings of the non-uniform array of openings are non-uniform.

15. The system of claim 11, wherein the non-uniform array of openings and respective webbings between the openings of the non-uniform array of openings tune a capacitance and an inductance of the plate to attenuate a particular frequency and/or a frequency range of EMI.

16. A system comprising:
a chassis having one or more electrical components; and
a plate configured to cover at least a portion of the chassis, the plate having a non-uniform array of openings through a thickness of the plate, the non-uniform array of openings arranged to admit a flow of cooling air and attenuating electromagnetic interference (EMI) through the plate;
wherein each opening of the non-uniform array of openings comprises a respective geometry, all immediately adjacent openings of the non-uniform array of openings comprise different respective geometries, and the non-uniform array of openings comprises:
a first opening;
a second opening immediately adjacent to the first opening; and
a third opening immediately adjacent to the second opening, wherein the first opening, the second opening, and the third opening are arranged such that the third opening overlaps with a reference axis extending through a first center of the first opening and through a second center of the second opening, and a third center of the third opening is offset from the reference axis;
wherein the non-uniform array of openings comprises a plurality of rows and a plurality of columns, the first opening is a part of a row of the plurality of rows and a part of a column of the plurality of columns, the second opening and the third opening are each a part of the row or are each a part of the column, the first center of the first opening is aligned with an additional reference axis that extends in overlap with the second opening and in overlap with the third opening, the second center of the second opening and the third center of the third opening are offset from the additional reference axis, and the second center and the third center are positioned at opposite sides of the first center of the first opening such that the additional reference axis extends between the second center and the third center.

17. The system of claim 16, wherein the non-uniform array of openings is arranged such that the non-uniform array of openings and respective webbings between the openings of the non-uniform array of openings tune a capacitance and an inductance of the plate to attenuate a particular frequency and/or a frequency range of EMI.

18. The system of claim 16, wherein respective webbings between the openings of the non-uniform array of openings are non-uniform.

19. The system of claim 16, further comprising webbing between the openings of the non-uniform array of openings, wherein the webbing defines an inductance of the plate, and the non-uniform array of openings defines a capacitance of the plate.

20. The system of claim 16, wherein each row of the plurality of rows has a horizontal axis, each column of the plurality of columns has a vertical axis, and the centers of the openings of the non-uniform array of openings have a non-uniform, vertical offset from the horizontal axis and a non-uniform, horizontal offset from the vertical axis.

* * * * *